(12) United States Patent
Baillin et al.

(10) Patent No.: US 9,511,991 B2
(45) Date of Patent: Dec. 6, 2016

(54) ENCAPSULATION STRUCTURE INCLUDING A MECHANICALLY REINFORCED CAP AND WITH A GETTER EFFECT

(71) Applicant: COMMISSARIAT A L'ENERGIE ATOMIQUE ET AUX ENE ALT, Paris (FR)

(72) Inventors: Xavier Baillin, Crolles (FR); Bernard Diem, Echirolles (FR); Jean-Philippe Polizzi, Grenoble (FR); Andre Rouzaud, Seyssinet (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 43 days.

(21) Appl. No.: 14/331,285

(22) Filed: Jul. 15, 2014

(65) Prior Publication Data
US 2015/0028433 A1    Jan. 29, 2015

(30) Foreign Application Priority Data
Jul. 26, 2013  (FR) ...................................... 13 57386

(51) Int. Cl.
*B81B 7/00* (2006.01)
*B81C 1/00* (2006.01)

(52) U.S. Cl.
CPC ........... *B81B 7/0058* (2013.01); *B81B 7/0038* (2013.01); *B81B 7/0077* (2013.01); *B81C 1/00285* (2013.01); *B81C 1/00301* (2013.01); *B81C 1/00682* (2013.01); *B81B 2201/0228* (2013.01); *B81B 2207/096* (2013.01);
(Continued)

(58) Field of Classification Search
None
See application file for complete search history.

(56) References Cited

U.S. PATENT DOCUMENTS

| 5,268,533 A | 12/1993 | Kovacs et al. |
| 7,897,436 B2 | 3/2011 | Bouche et al. |

(Continued)

FOREIGN PATENT DOCUMENTS

| EP | 1 640 328 A2 | 3/2006 |
| FR | 2 875 948 A1 | 3/2006 |

(Continued)

OTHER PUBLICATIONS

French Preliminary Search Report issued Apr. 14, 2014, in Patent Application No. FR 1357386, filed Jul. 26, 2013 (with English Translation of Category of Cited Documents).
(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A microdevice encapsulation structure arranged in at least one cavity formed between a substrate and a cap rigidly attached to the substrate is provided, the cap including one layer of a first material, one face of which forms an inner wall of the cavity, and mechanical reinforcement portions rigidly attached at least to and partly covering said face, having gas absorption and/or adsorption properties, in which the Young's modulus of a second material of the mechanical reinforcement portions is higher than that of the first material, wherein each of said portions includes at least one first layer of the second material, and at least one second layer of a third metallic getter material such that the first layer of the second material is arranged between the layer of the first material and the second layer of the third material and/or is covered by the second layer of the third material.

19 Claims, 9 Drawing Sheets

(52) U.S. Cl.
CPC .. *B81C2201/053* (2013.01); *B81C 2203/0136* (2013.01); *B81C 2203/0163* (2013.01); *H01L 2224/16145* (2013.01); *H01L 2224/16225* (2013.01)

(56) References Cited

U.S. PATENT DOCUMENTS

| | | |
|---|---|---|
| 2004/0173886 A1 | 9/2004 | Carley |
| 2006/0063462 A1* | 3/2006 | Ding et al. ............... 445/25 |
| 2006/0065941 A1 | 3/2006 | Delapierre |
| 2009/0194309 A1 | 8/2009 | Gillot et al. |
| 2010/0178419 A1 | 7/2010 | Baillin |
| 2011/0165365 A1 | 7/2011 | Brault et al. |
| 2011/0189844 A1 | 8/2011 | Pornin et al. |
| 2014/0342557 A1 | 11/2014 | Diem |

FOREIGN PATENT DOCUMENTS

| | | |
|---|---|---|
| FR | 2 901 264 A1 | 11/2007 |
| FR | 2 922 202 A1 | 4/2009 |
| FR | 2 934 580 A1 | 2/2010 |
| FR | 2 955 999 A1 | 8/2011 |

OTHER PUBLICATIONS

Toshiyuki Tsuchiya, et al., "Polysilicon Vibrating Gyroscope Vacuum-Encapsulated in an on-Chip Micro Chamber" Sensors and Actuators A, vol. 90, 2001, pp. 49-55.

Bernard S. Nasser, Jr., "The Correlation of Closed Form Solutions of a Stiffener to Finite Element Analyses of Stiffeners with Varying Geometry" Master of Engineering in Mechanical Engineering, Rensselaer Polytechnic Institute, Dec. 2011, 87 pages.

Eduard Ventsel, et al., "Thin Plates and Shells: Theory, Analysis and Applications" Pennsylvania State University, Marcel Dekker, Inc., 2001, 651 pages.

U.S. Appl. No. 14/555,913, filed Nov. 28, 2014, Baillin.
U.S. Appl. No. 14/725,028, filed May 29, 2015, Baillin.

* cited by examiner

ENCAPSULATION STRUCTURE INCLUDING A MECHANICALLY REINFORCED CAP AND WITH A GETTER EFFECT

CROSS-REFERENCE TO RELATED APPLICATION

This application is based upon and claims the benefit of priority under 35 U.S.C. §119 from prior French Patent Application No. 13 57386, filed on Jul. 26, 2013, the entire content of which is incorporated herein by reference.

TECHNICAL FIELD AND PRIOR ART

The invention relates to the field of encapsulation structures including one or more microdevices encapsulated in one or more cavities in hermetic fashion, for example in a controlled atmosphere. The invention advantageously applies to the encapsulation of resonant microdevices of the MEMS (Micro-Electro-Mechanical System) type.

The term "microdevice" designates any microsystem of the MEMS type, NEMS (Nano-Electro-Mechanical System) type, MOEMS (Micro-Opto-Electro-Mechanical System) type, NOEMS (Nano-Opto-Electro-Mechanical System) type, together with any type of electronic, optical or opto-electronic component or microcomponent.

There are currently two major families of techniques of encapsulation, or "pre-packaging", of microdevices enabling these microdevices to be protected, and in particular enabling the moving portions of these microdevices to be protected, whilst handling them and during subsequently implemented steps (cutting, packaging, etc.):

- Wafer Cap Packaging, where the cap is formed by a substrate, or wafer, of silicon or glass, which is generally micro-machined and bonded to the substrate on which microdevices are located, where this cap is then made thinner until a thickness of several tens of microns is obtained to optimise the bulk of this component before its final packaging, or with a view to stacking it in three dimensions with other components;
- Thin Film Packaging (TFP), comprising the production, directly above the microdevice, of a thin film (for example between about 1 and 10 microns thick) forming the cap of the structure in which the microdevice is encapsulated.

Bearing in mind the handling operations to which the microdevices encapsulated in this manner are subject, it is important that the caps protecting these microdevices have a good mechanical resistance in order to resist the stresses caused by these handling operations.

Several types of mechanical reinforcement have been proposed to increase the robustness of these thin or thinned caps, which are subject, for example, during overmoulding steps, to pressures equal to or greater than 100 bars, which generally cause major deformations, which may cause the caps subject to such pressures to fracture.

Document FR 2 901 264 describes the production of mechanical reinforcements in the form of protrusions from the top wall of a cap obtained by deposition of one or more thin layers. However, this method is compatible only with the production of caps made of thin layers and not with the production of caps by wafer cap packaging. In addition, with such reinforcements made outside the cavity, there is a high risk that delamination may occur between the reinforcements and the cap, since if the assembly defined by the protruding elements is more mechanically rigid than the cap the forces exerted on the cap can then cause delamination between the cap and the reinforcements. Lastly, the reinforcements described in this document are not sufficient for the encapsulation structure to be able to withstand pressures higher than or equal to about 100 bars, which are the pressures experienced when implementing a step of over-moulding of the microdevice encapsulated in this manner.

Document FR 2 955 999 describes the mechanical reinforcement of a cap obtained by deposition of one or more thin layers, via a localised deposition of a portion of mechanical reinforcement material covering the cap. Although the mechanical reinforcement obtained is good in terms of mechanical resistance given to the cap, the continuous reinforcement area produced in this manner over the entire surface of the cap prevents access to the cap or to the microdevice, for example preventing checks or optical measurements on the inside of the cap or on the encapsulated microdevice. In addition, the residual stresses which are located at the interface between the reinforcement material and the encapsulation layer can have a deleterious effect on the mechanical properties of the interface. Lastly, this method is compatible only with production of caps made of thin layers and not with the caps formed by wafer cap packaging.

Lastly, in both mechanical reinforcement solutions described above, no solution is described to control the atmosphere in which the microdevice is encapsulated.

DESCRIPTION OF THE INVENTION

Thus there is a need to propose an encapsulation structure the cap of which is mechanically reinforced, which is compatible with production by thin film packaging or by wafer cap packaging, and the atmosphere of which can easily be controlled.

To this end, one embodiment proposes an encapsulation structure of at least one microdevice made on and/or in a substrate and arranged in at least one cavity formed between a substrate and a cap rigidly connected to the substrate, in which the cap includes at least:

- one layer of a first material, one face of which forms an inner wall of the cavity, and
- mechanical reinforcement portions rigidly connected to at least said face of the layer of the first material, partly covering said face of the layer of the first material, and having gas absorption and/or adsorption properties, where these mechanical reinforcement portions include at least one second material, the Young's modulus of which is higher than that of the first material.

The mechanical reinforcement portions incorporated in this manner in the cap strengthen and greatly consolidate the encapsulation structure, and in particular make it resistant to the final stages of handling and of packaging which the encapsulation structure is intended to undergo. In addition, by producing these mechanical reinforcement portions at the inner wall of the cavity and with a material the Young's modulus of which is higher than that of the material of the layer of the cap, the production of such a cap is compatible both with thin film packaging and with wafer cap packaging of an advantageously thinned substrate. This encapsulation structure uses only elements compatible with conventional microelectronic techniques.

In addition, the mechanical reinforcement portions have gas absorption and/or adsorption properties, i.e. they include a getter function which will enable the atmosphere in the cavity to be controlled, both in terms of the nature and of the partial pressure of the residual gases in the cavity.

Such an encapsulation structure is advantageously used to protect microdevices, for example MEMS of the inertial type including moving parts (free or embedded beams, membranes, seismic masses, microtubes, etc.), before they are included in a final packaging line. This is, in addition, implemented using low-cost collective manufacturing technologies. Such an encapsulation structure can also be transferred directly to a printed circuit or PCB ("Printed Circuit Board").

The second material may be a metallic getter material. It is thus possible to produce mechanical reinforcement portions with a material having at once gas absorption and/or adsorption properties and high mechanical resistance properties.

Each of the mechanical reinforcement portions may include at least one first layer of the second material and at least one second layer of a third metallic getter material such that the first layer of the second material is arranged between the layer of the first material and the second layer of the third material and/or is covered by the second layer of the third material.

By this means the production of each of the mechanical reinforcement portions with these different layers of materials enables the constraints relating to the maximum production thicknesses of the materials used to form the mechanical reinforcement portions to be overcome. Such a multi-layer structure of the mechanical reinforcement portions is advantageously used to produce mechanical reinforcement portions which are more than about 0.5 µm thick.

In addition, in this configuration, the first layer of the second material can be used as a sub-layer for adjusting the thermal activation temperature of the third metallic getter material. The second material may in this case be a metal such as Cr and/or Ti and/or Co and/or Fe and/or Mn and/or Mo and/or Ta and/or V and/or W, and/or advantageously Ru and/or Pt and/or Cr and/or Ni. The details for production of such an adjustment sub-layer are described, for example, in document FR 2 922 202.

Each of the mechanical reinforcement portions may include a stack of layers two at least of said layers of which form a bimetallic strip exerting on the cap a force directed outside the cavity.

The first material may comprise Si and/or silica and/or silicon nitride, and the second material may comprise Cr and/or Ti and/or Co and/or Fe and/or Mn and/or Mo and/or Ta and/or V and/or W and/or Pd and/or Rh and/or Pt and/or Ru and/or Zr. When one of the metallic getter materials contains Zr this material can be associated with one of the other materials mentioned above, the Young's modulus of which is higher than that of the first material.

The metallic getter material(s) may comprise Cr and/or Ti and/or Co and/or Fe and/or Mn and/or Mo and/or Ta and/or V and/or W and/or Pd and/or Rh and/or Pt and/or Ru and/or Zr.

The term "comprise" may designate equally the material in question and one of its alloys.

Each of the mechanical reinforcement portions may be of roughly rectangular parallelepipedic shape, and the mechanical reinforcement portions may be arranged roughly parallel relative to one another. As a variant, the mechanical reinforcement portions may form a mesh on said face of the layer of the first material. These configurations of mechanical reinforcement portions enable these portions to play a positive role in the accidental case of the appearance of cracks in the layer of the first material, by diverting these cracks at the interfaces between the layer of the first material and the mechanical reinforcement portions.

A ratio $r=h/H$ may be between about 0.6 and 0.9, and a ratio $R=b/t$ may be higher than or equal to about 0.7, where:
h: thickness of the layer of the first material;
H: sum of h and of the thickness of one of the mechanical reinforcement portions;
b: width of one of the mechanical reinforcement portions;
t: period with which the mechanical reinforcement portions are arranged on the layer of the first material.

The encapsulation structure may also include electrically conductive vias made all the way through the substrate and/or the layer of the first material, next to the cavity. Such vias can form, for example, electrical points connecting to the encapsulated microdevice.

Another embodiment relates to a microelectronic device including at least two encapsulation structures as described above, arranged one above the other, in which at least one electrically conductive via of a first of the two encapsulation structures is electrically connected to at least one electrically conductive via of a second of the two encapsulation structures, directly or through an interposer. It is thus possible, for example, to connect electrically at least two microdevices encapsulated in this manner, the encapsulation structures of which are superposed on one another. When the caps of these encapsulation structures are thin layers or thinned substrates the device obtained in this manner is thin and facilitates assembly in three dimensions of the encapsulation structures, i.e. the superposition of these encapsulation structures. The superposed microdevices can have different functions, one corresponding, for example, to a gyroscope and the other corresponding to an accelerometer. Such a microelectronic device can be transferred directly on to a PCB.

Another embodiment relates to a method of encapsulation of at least one microdevice, including at least the following steps:
production of the microdevice on and/or in a substrate;
production of mechanical reinforcement portions rigidly attached to at least one face of a layer of a first material, partly covering said face of the layer of the first material, and having gas absorption and/or adsorption properties, where the layer of the first material and the mechanical reinforcement portions form a cap;
rigid attachment of the cap to the substrate such that the microdevice is encapsulated in a cavity formed between the cap and the substrate;
and in which the mechanical reinforcement portions include at least one second material, the Young's modulus of which is higher than that of the first material.

Such a method of encapsulation by wafer cap packaging enables an encapsulation structure as described above to be obtained. Such a method also corresponds to a method of encapsulation by transfer of a cap formed by deposition of one or more thin layers in a mould.

Another embodiment relates to a method of encapsulation of at least one microdevice, including at least the following steps:
production of the microdevice on and/or in a substrate;
production of a portion of sacrificial material at least on the microdevice and such that the volume occupied by the portion of sacrificial material corresponds to at least one part of a volume of a cavity in which the microdevice is intended to be encapsulated;
production of mechanical reinforcement portions on and/or in the portion of sacrificial material and having gas absorption and/or adsorption properties;

deposition of a layer of a first material covering at least the mechanical reinforcement portions and the portion of sacrificial material;

etching of the portion of sacrificial material, forming the cavity in which the microdevice is encapsulated;

and in which the mechanical reinforcement portions include at least one second material, the Young's modulus of which is higher than that of the first material.

Such a method of encapsulation by TFP enables an encapsulation structure as described above to be obtained.

Each of the mechanical reinforcement portions may be produced at least by a deposition of a first layer of the second material, and of a second layer of a third metallic getter material such that the first layer of the second material is arranged between the layer of the first material and the second layer of the third material and/or is covered by the second layer of the third material.

Each of the mechanical reinforcement portions may be produced by a deposition of a stack of layers two at least of said layers of which form a bimetallic strip exerting on the cap a force directed outside the cavity.

The method may also include, after rigid attachment of the cap to the substrate, or etching of the portion of sacrificial material, production of electrically conductive vias all the way through the substrate and/or the layer of the first material, next to the cavity.

Lastly, another embodiment relates to a method of manufacture of a microelectronic device, including implementation of a method of encapsulation as described above, and forming at least two encapsulation structures, where said encapsulation structures are arranged one above the other, where at least one electrically conductive via of a first of the two encapsulation structures is then electrically connected to at least one electrically conductive via of a second of the two encapsulation structures directly or through an interposer.

BRIEF DESCRIPTION OF THE ILLUSTRATIONS

The present invention will be better understood on reading the description of example embodiments given purely as an indication and in no sense restrictively, making reference to the appended illustrations in which.

Identical, similar or equivalent parts of the various figures described below have the same numerical references, to make it easier to move from one figure to another.

The various parts shown in the figures are not necessarily shown at a uniform scale, in order to make the figures more readable.

The various possibilities (variants and embodiments) must be understood as not being mutually exclusive, and being able to be combined with one another.

DETAILED DESCRIPTION OF PARTICULAR EMBODIMENTS

Figure 1:
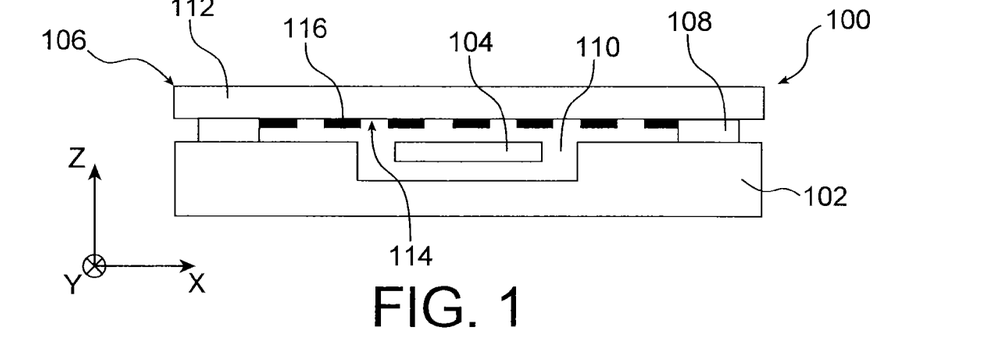
FIG. 1 shows a section view of an encapsulation structure according to a first embodiment.

Reference is firstly made to FIG. 1, which shows a section view of an encapsulation structure 100 according to a first embodiment.

The encapsulation structure 100 includes a substrate 102 in which a microdevice 104 is produced. This microdevice 104 is, for example, a MEMS of the inertial type including one or more moving parts (beams, membranes, seismic masses, microtubes, etc.). A cap 106 is rigidly attached to the substrate 102 through a sealing bead 108 which delimits laterally a cavity 110 in which the microdevice 104 is encapsulated. The cap 106 includes a layer 112 of a first material corresponding to a thinned substrate, which is, for example, between about 5 µm and 100 µm thick. A face 114 of the layer 112 forms an inner wall of the cavity 110, in this case an upper wall of the cavity 110. Lastly, mechanical reinforcement portions 116 having gas absorption and/or adsorption properties, and including at least one metallic getter material, are produced against the face 114 of the layer 112, having the dual function of gas pumping and mechanical reinforcement of the cap 106.

Figure 2:
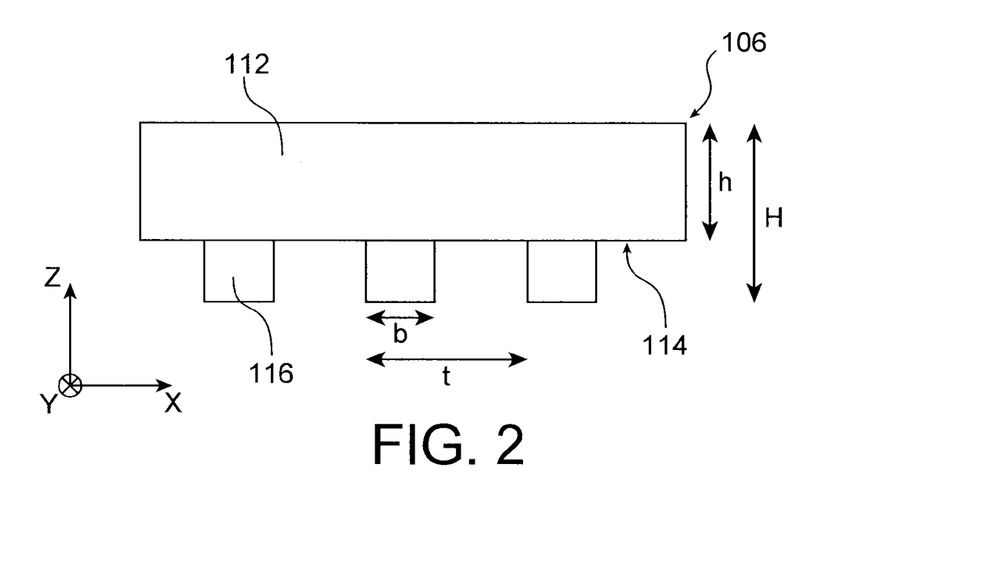
FIGS. 2 and 3 show respectively a profile section view and a view from beneath of a part of a first example embodiment of a cap of an encapsulation structure.
Figure 3:
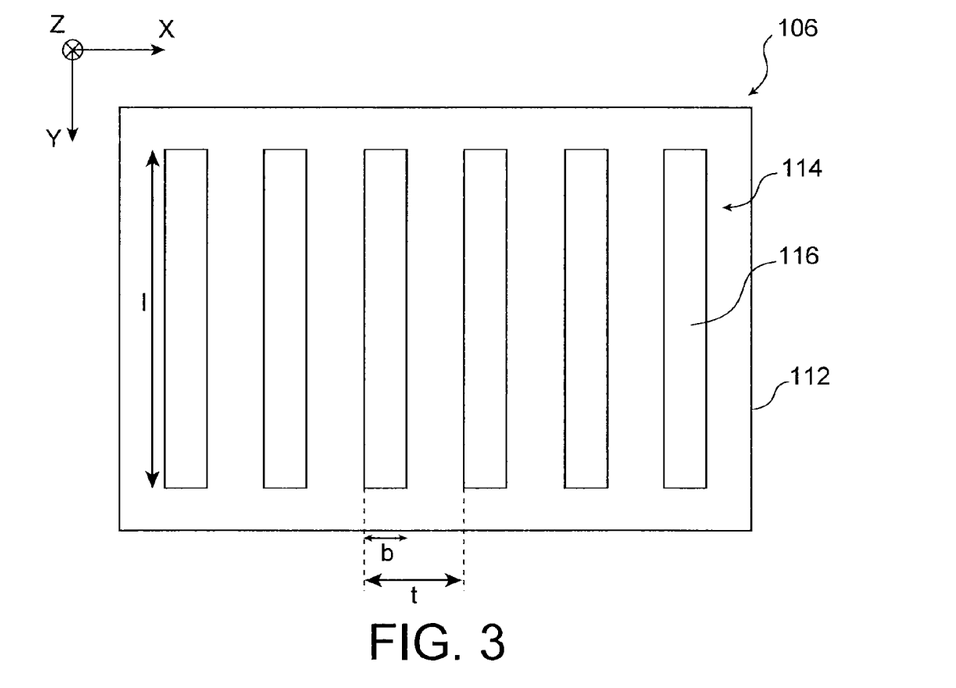

A first example embodiment of the cap 106 is described in connection with FIGS. 2 and 3, showing respectively a profile section view and a view from beneath of a part of the cap 106.

In this first example embodiment, each of the mechanical reinforcement portions 116 is of rectangular parallelepipedic shape, and is arranged against the face 114 of the layer 112. These mechanical reinforcement portions 116 are arranged next to one another, and parallel to one another (and are aligned parallel to axis Y in the example shown in FIGS. 2 and 3). Each of the mechanical reinforcement portions 116 has a length l (dimension in axis Y) which is roughly equal to the width of the part of the face 114 which forms the upper wall of the cavity 110 (which depends in particular on the dimensions of the cavity 110, and therefore on the dimensions of the encapsulated microdevice 104). The mechanical reinforcement portions 116 are distributed throughout the length of this part of the face 114, in order to consolidate the entire upper wall of the cavity 110 mechanically. The peripheral parts of the face 114 which are not covered by the mechanical reinforcement portions 116 correspondent in particular to the parts of the layer 112 intended to be in contact with the sealing bead 108. Each of the mechanical reinforcement portions 116 has a width b (dimension along axis X), where these portions 116 are also arranged next to one another with a period t, where this period is equal to the sum of width b and the space separating two mechanical reinforcement portions. Lastly, the layer 112 has a thickness h (dimension along axis Z), and the cap 106 has an overall thickness H equal to the sum of thickness h of the layer 112 and the thickness of the mechanical reinforcement portions 116 (where each mechanical reinforcement portion 116 therefore has a thickness equal to H-h).

In order that the mechanical reinforcement portions 116 play both their role of mechanical reinforcement of the cap 106 and that of gas pumping, these portions 116 are produced, in this first example embodiment, with a metallic getter material the Young's modulus of which is higher than or equal to that of the first material of the layer 112 (where this first material is in this case silicon, the Young's modulus of which is equal to about 110 GPa). Thus, in this first example embodiment, each of the mechanical reinforcement portions 116 includes a portion of one or more of the following materials: chromium, molybdenum, tantalum, tungsten, vanadium, cobalt, iron, manganese, nickel, copper, ruthenium, platinum. When the layer 112 is made of silica, and contains for example glass such as glass of the Pyrex® type, the Young's modulus of which is equal to 70 GPa, or deposited $SiO_2$ (for example in the case of a cap formed by thin layer deposition), the Young's modulus of which is also 70 GPa, the mechanical reinforcement portions 116 can also include hafnium and/or niobium and/or titanium.

The mechanical reinforcement portions 116 are advantageously dimensioned and arranged such that a ratio r=h/H is between about 0.6 and 0.9, and such that a ratio R=b/t is greater than or equal to about 0.7. More precisely, considering a parameter M=E(X)/E(Y), with E(X) the Young's modulus of the material of mechanical reinforcement portions 116 and E(Y) the Young's modulus of the first material of layer 112, a parameter O=H/b and a ratio of moments of inertia Dy/D=2, where Dy is equal to the moment of inertia of cap 106 (layer of first material 112+mechanical reinforcement portions 116) and D is equal to the moment of inertia of the layer of first material 112 on its own, i.e. without mechanical reinforcement portions 116, ratios r and R can be chosen as indicated in the table below:

| M | O | r | R |
|---|---|---|---|
| 2 | 2 | [0.6-0.8] | ≥0.8 |
| 2 | 5 | [0.6-0.8] | ≥0.7 |
| 3 | 2 | [0.6-0.8] | ≥0.7 |
| 3 | 5 | [0.6-0.9] | ≥0.8 |

As an example, for a layer 112 including silicon and mechanical reinforcement portions 116 including tungsten, the mechanical reinforcement portions 116 can be dimensioned such that:

| O | H (μm) | b (μm) | h (μm) | t (μm) | (H-h) (μm) |
|---|---|---|---|---|---|
| 2 | 50 | 25 | [30-40] | ≤35.7 | [10-20] |
| 5 | 50 | 10 | [30-45] | ≤12.5 | [5-20] |

In the case of a layer 112 produced by thin layer deposition (with the thickness for example less than or equal to about 10 μm) of $SiO_2$, the associated Young's modulus of which is 70 GPa, the following dimensioning rules can be followed in producing the mechanical reinforcement portions 116:

| M | O | H (μm) | b (μm) | h (μm) | t (μm) | (H-h) (μm) |
|---|---|---|---|---|---|---|
| 3 | 2 | 10 | 5 | 6-8 | <=7.14 | 2-4 |
| 3 | 5 | 5 | 2.5 | 3-4 | <=3.12 | 2-3 |

As a variant, the mechanical reinforcement portions 116 can include several layers, or parts, of different materials superposed on one another. Thus, in FIG. 4, each of the mechanical reinforcement portions 116 includes a first layer of material 118 and a second layer of material 120 arranged one above the other such that the first layer 118 is arranged between the face 114 of the layer 112 and the second layer 120. According to another variant embodiment shown in FIG. 5, for each of the mechanical reinforcement portions 116, the second layer 120 completely covers the first layer 118. According to these variants, the second layer 120 can include one or more getter materials such as those previously described, or again titanium and/or zirconium or an alloy containing titanium or zirconium having a getter effect.

Figure 4:
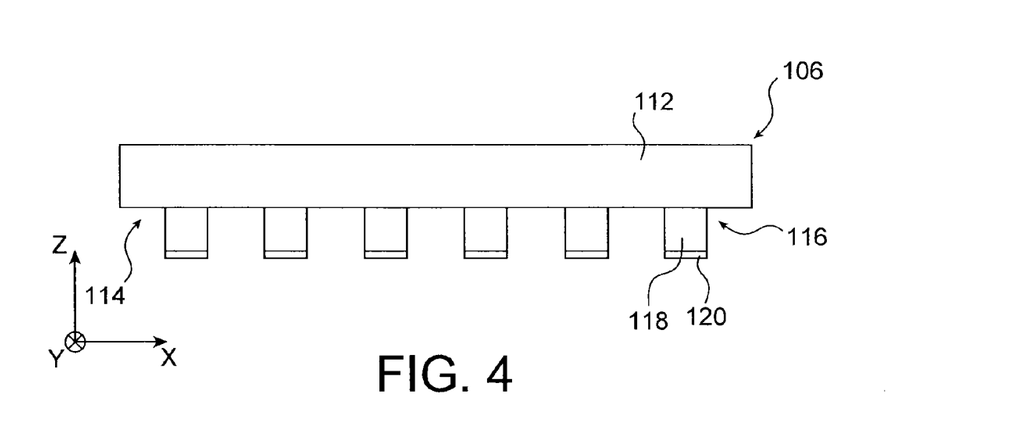
FIGS. 4 and 5 show partial profile section views of variants of the cap of the encapsulation structure according to the first example embodiment.
Figure 5:
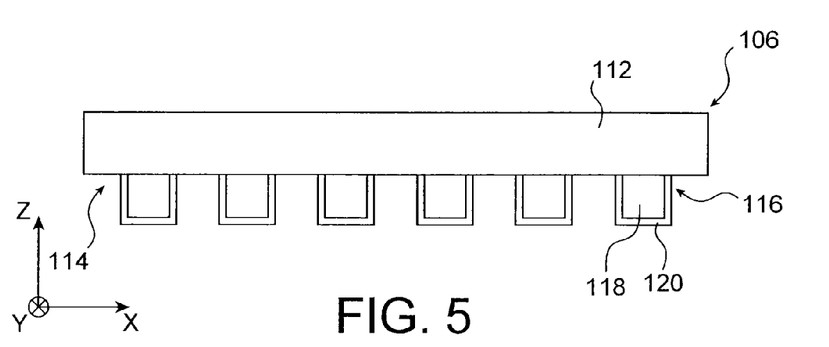

In each of these mechanical reinforcement portions 116 formed from several layers of different materials, it is possible to use a metallic getter material to produce the upper layer (the layer 120 in the examples of FIGS. 4 and 5), or one of those previously described, and to use a material which does not have the gas absorption and/or adsorption properties to produce the remainder of the mechanical reinforcement portions 116, i.e. the layer 118 in the examples of FIGS. 4 and 5. It is thus possible to make use, in producing the layers 118, of materials which can be deposited with greater thicknesses than the metallic getter materials, which enables thicker mechanical reinforcement portions 116 to be produced, and therefore enables the mechanical consolidation of the cap 106, obtained due to the mechanical reinforcement portions 116, to be improved.

In the case of a silicon layer 112, the layer 118 can include one or more metals such as chromium, molybdenum, tantalum, tungsten, vanadium, cobalt, iron, manganese, nickel, copper, ruthenium or platinum. In the case of a layer 112 made of silica and comprising for example $SiO_2$, in addition to the previously mentioned materials, it is possible for the layer 118 to include hafnium and/or niobium and/or titanium.

As a variant, each of the mechanical reinforcement portions 116 can include more than two layers of different materials and/or include at least two layers of metallic getter materials, notably different from one another.

Figure 6:
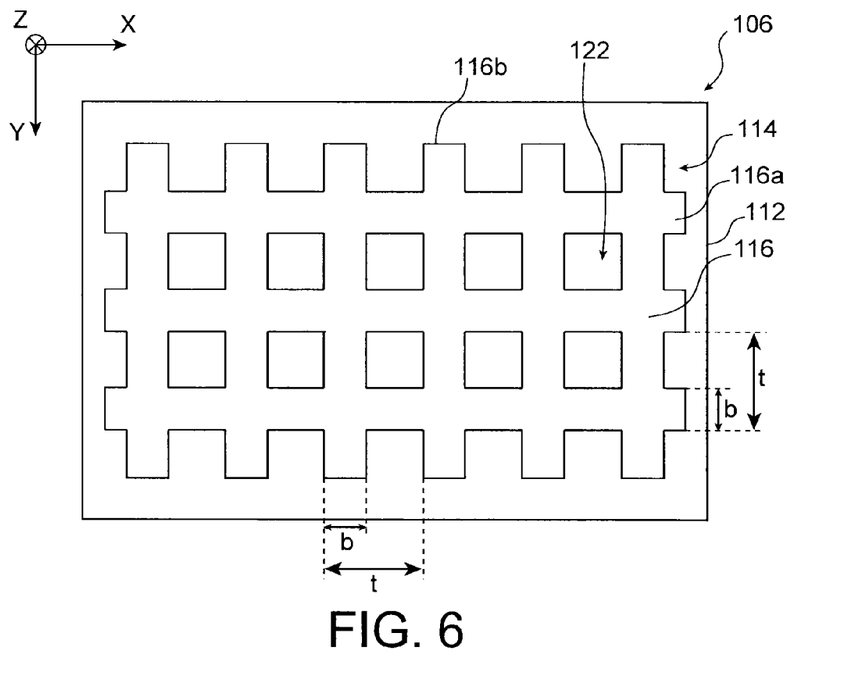
FIG. 6 shows a view from beneath of a part of a second example embodiment of a cap of an encapsulation structure.

FIG. 6 shows a view from beneath of a second example embodiment of the cap 106. The mechanical reinforcement portions 116 are in this case produced in the form of a mesh, i.e. in the form of portions which intersect, forming a grid. Parts 122 of the face 114 which are not covered by the portions 116 forming parts of the upper wall of the cavity 110, the shape of which corresponds to the links of the mesh produced by the mechanical reinforcement portions 116, are in this case square in shape (in the plane of the face 114). Compared to the first example embodiment previously described in connection with FIGS. 2 and 3, the second example embodiment of the mechanical reinforcement portions 116 enables an improved mechanical reinforcement of the cap 106 to be obtained, and/or a relaxation of the stress relating to previously described parameter t, since, for an identical mechanical reinforcement, period t with which the portions 116 are arranged in this second example embodiment is longer than period t with which the portions 116 are arranged in the first example embodiment. In this manner, for an identical mechanical reinforcement of the cap 106, it is therefore possible, with this second example embodiment, to increase the spacing between the mechanical reinforcement portions 116.

In the example shown in FIG. 6, first mechanical reinforcement portions 116*a* are of rectangular parallelepipedic shape, and are arranged parallel to axis X, and second mechanical reinforcement portions 116*b* are of rectangular parallelepipedic shape, and arranged parallel to axis Y, and intersect the first mechanical reinforcement portions 116*a* perpendicularly. As a variant, the parts 122 of the face 114 which are not covered by the mechanical reinforcement portions 116 can be of rectangular or hexagonal shape, or of a completely different shape. The previously described values of ratios r and R also apply to this second embodiment. In addition, the variant embodiments of the mechanical reinforcement portions 116 in the form of several layers of different materials previously described can apply to this second example embodiment of the cap 106.

When the mechanical reinforcement portions 116 include several superposed layers of materials, the material used to produce the lower layer (the layer 118 in the examples of FIGS. 4 and 5) located under the upper layer including a metallic getter material (the layer 120 in the examples of FIGS. 4 and 5) can be chosen such that it modifies the thermal activation temperature of the getter material of the upper layer. It is thus possible, for example, to increase the thermal activation temperature of the getter material of the upper layer according to the melting point of the material of the under-layer, as described, for example, in document FR 2 922 202. For example, for an upper layer made of titanium and/or zirconium, it is possible to have a thermal activation temperature of the material of this upper layer of between about 250° C. and 375° C. by using, to produce the lower layer, one or more metals such as W, Ta, Mo, Ru, Cr, Pt, Fe, Co, Ni, Mn or Cu, where these metals are listed here in increasing order of the thermal activation temperature which is able to be obtained. With such a configuration it is possible to achieve a compromise between the temperature of the sealing cycle which is less than the thermal activation temperature, and the protection of the encapsulated device.

The mechanical reinforcement portions 116 can also allow the cap 106 to be pre-stressed through the formation of intrinsic tension stresses in the mechanical reinforcement portions 116. Several methods of deposition of materials used in microelectronics and applied here for the production of the mechanical reinforcement portions 116 enable this to be obtained (cathodic sputtering, hardening by polarisation of the substrate, etc., in order to control the density and microstructure of the deposit). It is thus possible, for example, to "pre-deform" the cap 106, during production, in the direction opposite to a deformation which the cap 106 will undergo in a subsequent step, such as a step of over-moulding.

Similarly, when the mechanical reinforcement portions 116 contain several superposed layers of materials, materials having different expansion coefficients (for example to produce the layers 118 and 120) can be used for production of the mechanical reinforcement portions 116. Each mechanical reinforcement portion 116 then forms a bimetallic strip which, under the action of the temperature, and in particular during the assembly operations, will increase the mechanical resistance of the cap 106. Indeed, the bimetallic strip which is not deformed at ambient temperature will be able to oppose the external stresses acting on the cap 106. To produce such a bimetallic strip, a pair of materials is chosen to produce the layers 118 and 120 of the mechanical reinforcement portions 116 such that the material with the higher thermal expansion coefficient is deposited against the face 114 of the layer 112, while the second element of the bimetallic strip (the getter material), which has a lower thermal expansion coefficient, is deposited on this first material. Such a bimetallic strip effect can, for example, be obtained by making the first layer 118 of nickel and by making the second layer 120 of titanium. In addition, the use of nickel to produce the first layer 118 also has the benefit that it can easily be deposited by electrolytic deposition (ECD) up to thicknesses of about 10 μm to 20 μm. Such a pair of materials therefore enables the previously defined design rules to be met.

As a variant, a bimetallic strip effect at ambient temperature enabling a force directed towards the outside of the cavity 110 to be exerted can be caused by choosing a pair of materials such that the material deposited against the face 114 has the lower thermal expansion coefficient of these two materials, on which the getter is deposited at a temperature higher than that of the first deposit. As an example, to reinforce a cap made of silicon, it is possible firstly to deposit tungsten and/or molybdenum and/or chromium on the cap, and then to deposit titanium and/or zirconium. To reinforce a thin film cap the same materials can be used, where the getter effect material is deposited first on the sacrificial layer, at a temperature higher than the one used to produce the second deposit.

Figure 7:
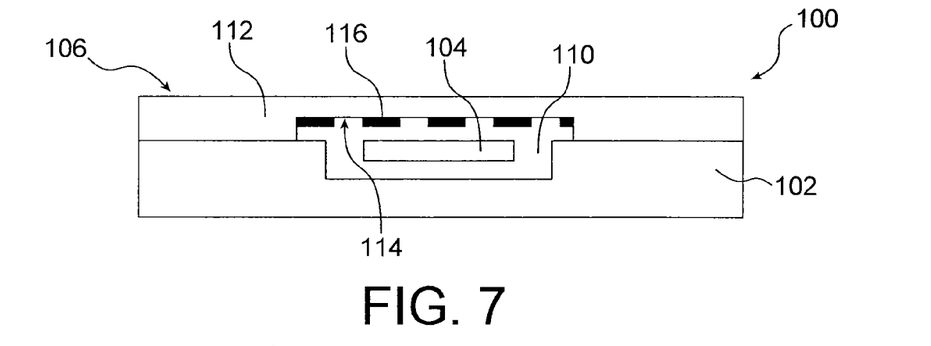
FIG. 7 shows a section view of an encapsulation structure according to a variant of the first embodiment.

FIG. 7 shows a section view of the encapsulation structure 100 according to a first variant embodiment. Compared to the encapsulation structure 100 previously described in connection with FIG. 1, the cap 106 and the substrate 102 are rigidly attached directly to one another, without the sealing bead 108, for example by anodic or eutectic bonding, depending on the nature of the materials of the layer 112 and of the substrate 102. A direct silicon-silicon bond is for example produced when the layer 112 and the substrate 102 both contain silicon. Alternatively, an anodic bond is for example produced when the layer 112 contains glass and the substrate 102 contains silicon. In this variant of the first embodiment, due to the fact that the side walls of the cavity 110 are not formed by a sealing bead, at least a part of the cavity 110 is formed by etching a part of the thickness of the layer 112, where the base of the etching forms the wall 114. The mechanical reinforcement portions 116 are arranged in the area of this etched wall. When the layer 112 of the cap 106 is etched in this manner the side edges of the mechanical reinforcement portions 116 can be in contact with the side walls of this etched part of the layer 112, to form an additional mechanical support for the mechanical reinforcement portions 116.

Figure 8:
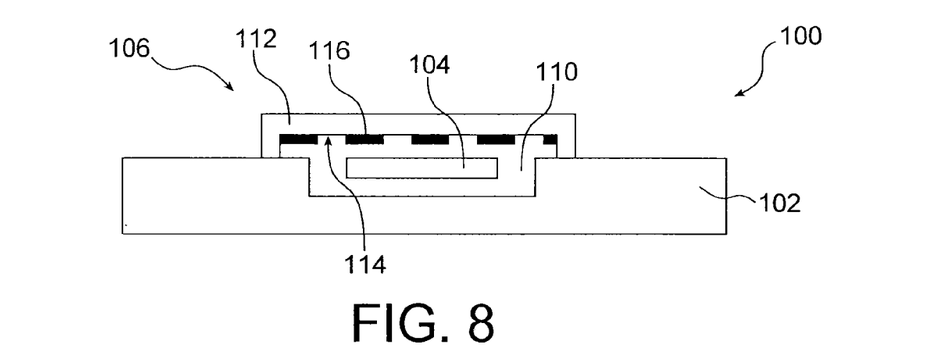
FIG. 8 shows a section view of an encapsulation structure according to a second embodiment.

FIG. 8 shows a section view of the encapsulation structure 100 according to a second embodiment. Compared to the encapsulation structure 100 described above in connection with FIGS. 1 to 7, the layer 112 of the cap 106 is not a thinned substrate, but one or more deposited thin layers of the TFP type, the thickness of which is for example less than or equal to about 5 μm. The mechanical reinforcement portions 116 are arranged on the face 114 of the layer 112 forming the inner top wall of the cavity 110.

Figure 9A:
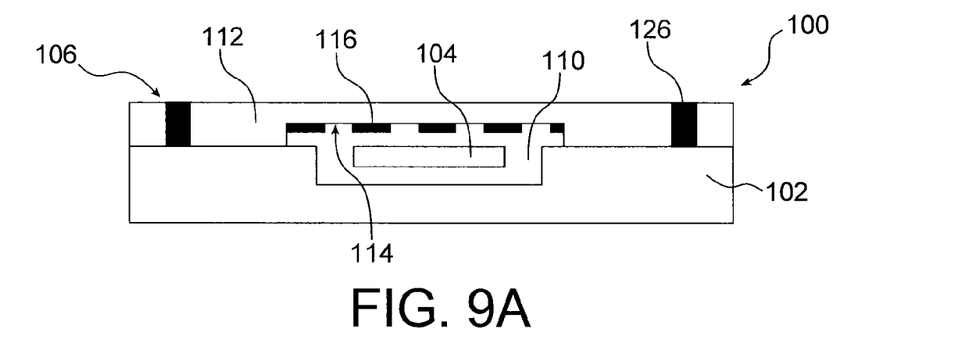
FIGS. 9A and 9B show section views of an encapsulation structure according to other variant embodiments.
Figure 9B:
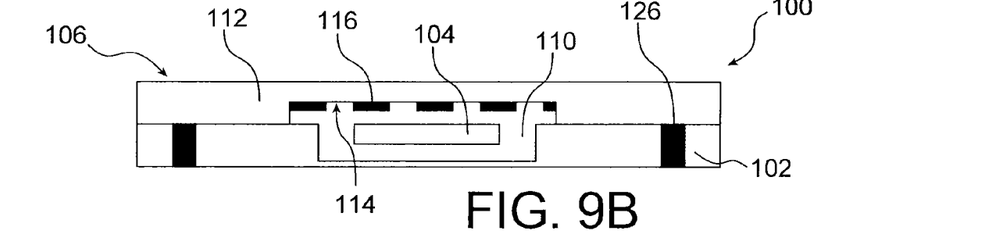

As shown in FIGS. 9A and 9B, electrical connectors, or electrically conductive vias 126, come through the layer 112 and/or the substrate 102. These vias 126 can, for example, be electrically connected to the encapsulated microdevice 104 and thus form electrical input and/or output points of this microdevice 104. Such electrically conductive vias can be produced in an encapsulation structure the cap of which is produced by deposition of thin films or by wafer cap packaging.

Figure 10A:
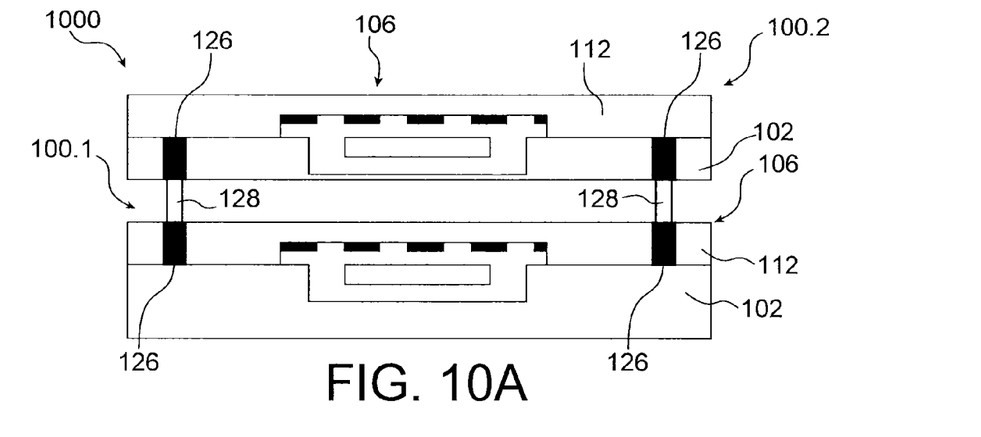
FIGS. 10A and 10B show section views of a microelectronic device including several encapsulation structures which are superposed and electrically connected to one another.
Figure 10B:
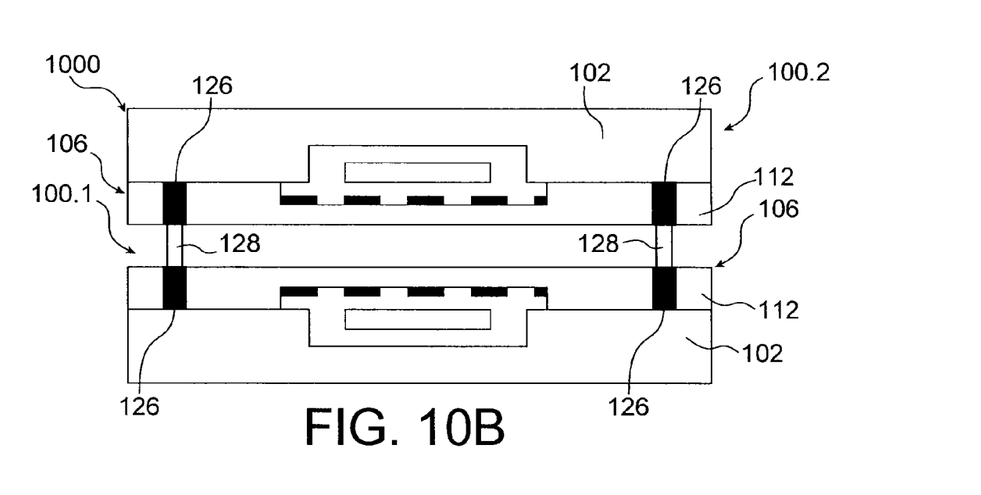

Several encapsulation structures similar to those shown in FIGS. 9A and 9B can be superposed one above the other, and electrically connected to one another through their vias 126, and electrical interconnections electrically connecting these vias 126 to one another. FIGS. 10A and 10B are section views of a microelectronic device 1000 including two superposed encapsulation structures 100.1 and 100.2 which are electrically connected to one another. In the example of FIG. 10A, the vias 126 coming through the cap 106 of a first encapsulation structure 100.1 are electrically connected to the vias 126 which come through the substrate 102 of a second encapsulation structure 100.2 through electrical interconnections 128 made between the two encapsulation structures 100.1 and 100.2. In the example of FIG. 10B, the vias 126 coming through the cap 106 of a first encapsulation structure 100.1 are electrically connected to the vias 126 which come through the cap 106 of a second encapsulation structure 100.2 through electrical interconnections 128. In both these cases it is possible that first encapsulation structure 100.1 and/or second encapsulation structure 100.2 has/have electrically conductive vias which come through the substrate 102 and the cap 106 of the same encapsulation structure. In a general manner, the device 1000 can contain several encapsulation structures in which microdevices are packaged having different functions (gyroscope, accelerometer, etc.).

Figure 10C:
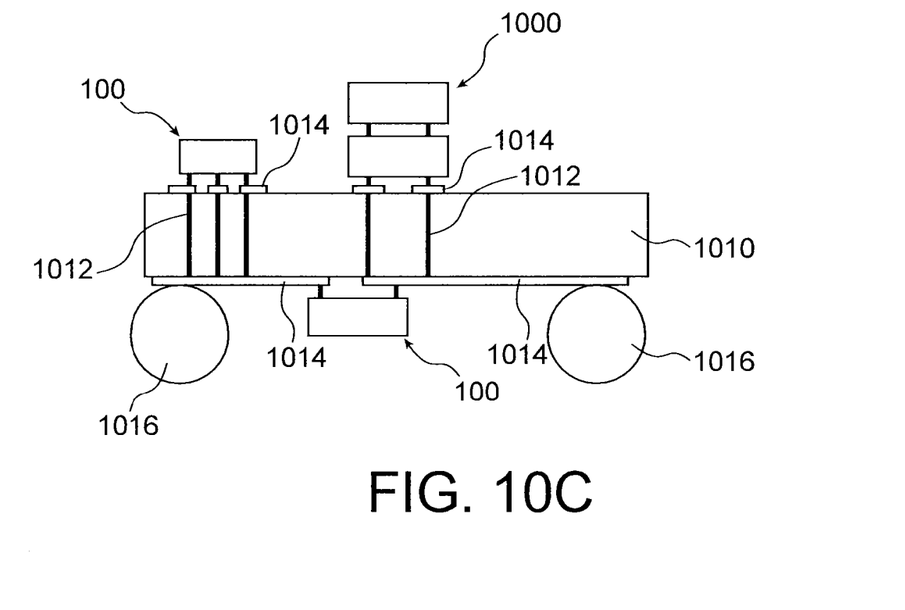
FIG. 10C shows a section view of several encapsulation structures and microelectronic devices electrically connected to one another through an interposer.

As shown in FIG. 10C, one or more encapsulation structures 100 and/or one or more microelectronic devices 1000, forming electronic chips, can be connected to a platform used to contain several chips, possibly on both main faces, and to connect them electrically to one another. In FIG. 10C this platform is formed by an interposer 1010, for example made of silicon or glass. This interposer 1010 contains through electrical connectors 1012 of the TSV type ("Through Silicon Via") when the interposer 1010 is made of silicon, or of the TGV ("Through Glass Via") when interposer the 1010 is made of glass. These connectors are electrically connected by a network of conductive rerouting lines (Redistribution Layers, or RDL), referenced 1014 in FIG. 10C and formed on one or both faces of the interposer 1010. The microelectronic devices 1000 and/or the encapsulation structures 100 can be juxtaposed and/or superposed the ones above the others on one side or both sides of the interposer 1010. Fusible bumps 1016 can be produced, for example, on one side of the interposer 1010 and can be electrically connected to one or more rerouting lines.

FIGS. 11A to 11E show the steps of a method of production of the encapsulation structure 100 according to the second embodiment, i.e. in which the cap 106 includes a layer 112 corresponding to one or more thin layers formed by deposition.

Figure 11A:
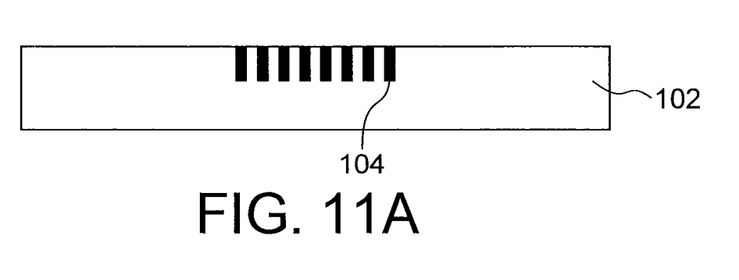
FIGS. 11A to 11E show the steps of a method to produce an encapsulation structure according to the second embodiment.

As shown in FIG. 11A, the microdevice 104 is firstly produced in the substrate 102 through the use of conventional microelectronics steps (deposition, photolithography, etching, etc.).

Figure 11B:
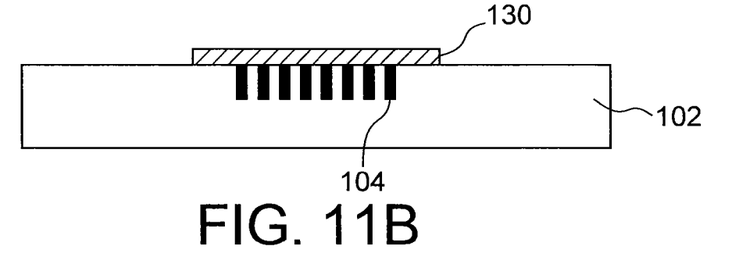

A sacrificial layer is then deposited on the substrate 102, notably covering the microdevice 104. This sacrificial layer is then shaped, for example by etching, in order that a remaining portion 130 of sacrificial layer, arranged on the microdevice 104, occupies a volume corresponding to that of the cavity 110 in which the microdevice 104 is intended to be encapsulated (FIG. 11B).

Figure 11C:
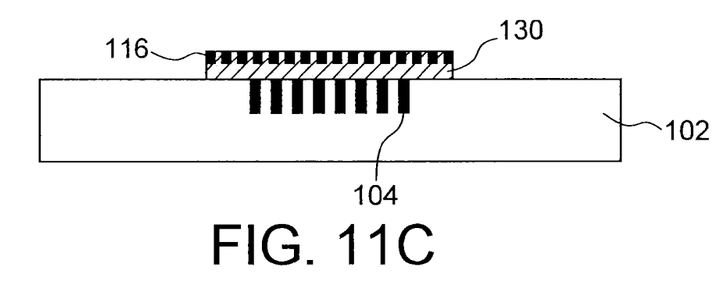

As shown in FIG. 11C, the mechanical reinforcement portions 116 are then produced on the portion of sacrificial material 130.

To accomplish this, the mechanical reinforcement portions 116 can be directly produced on the portion of sacrificial material 130 by deposition of one or more materials, depending on whether the mechanical reinforcement portions 116 contain one or more superposed layers of materials. The deposited material or materials can then be structured by photolithography followed by chemical etching, forming the mechanical reinforcement portions 116. It is then possible to deposit, between the mechanical reinforcement portions 116, a sacrificial material, for example of a similar nature to that of the portion 130, which will be etched simultaneously with the portion 130 during the subsequent formation of the cavity 110. This sacrificial material can in this case be deposited and then planarised, with stop on the mechanical reinforcement portions 116.

As a variant, it is possible to etch in the portion of sacrificial material 130 locations for the mechanical reinforcement portions 116, and then to deposit the material(s) of these mechanical reinforcement portions 116 in the etched locations.

When the thickness of the mechanical reinforcement portions 116 is less than or equal to about 2 µm, the material of these portions 116 can be deposited directly by PVD (Physical Vapour Deposition) on the portion of sacrificial material 130. The thickness of the mechanical reinforcement portions 116 can be increased by using several successive PVD deposits, for example of different materials.

When the thickness of the mechanical reinforcement portions 116 is greater than about 2 µm, it is possible to deposit firstly a germination layer by PVD, and then to deposit the material or materials of the mechanical reinforcement portions 116 by ECD. It is thus possible, for example, to produce a first deposit of titanium and of nickel, of thickness of between about 10 nm and several hundred nanometers, by PVD through a resin mask, and then to deposit nickel by electrolysis through the mask over a thickness, for example, of between 1 micron and several tens of microns. When the thickness of the material of the mechanical reinforcement portions 116 deposited by ECD is substantial, for example greater than about several tens of microns, the ECD deposit is advantageously extended beyond the thickness of the resin mask. Indeed, once this height has been exceeded, the deposited material also grows laterally, by this means giving to the mechanical reinforcement portions 116 a profile with a "mushroom" shape, i.e. having an upper part which is wider than the remainder of the portion, which limits the spaces between the mechanical reinforcement portions 116 which are intended to be plugged by the layer 112 which is then deposited. In the above example, the first titanium deposit forms the upper layer 120 of the mechanical reinforcement portions 116, whereas the deposited nickel forms the layer 118 of these mechanical reinforcement portions 116. The deposited titanium thickness is advantageously greater than about 100 nm. The resin mask is then removed and the portions of the germination layer between the mechanical reinforcement portions 116 are then etched, with stop on the portion of sacrificial material 130.

Figure 11D:
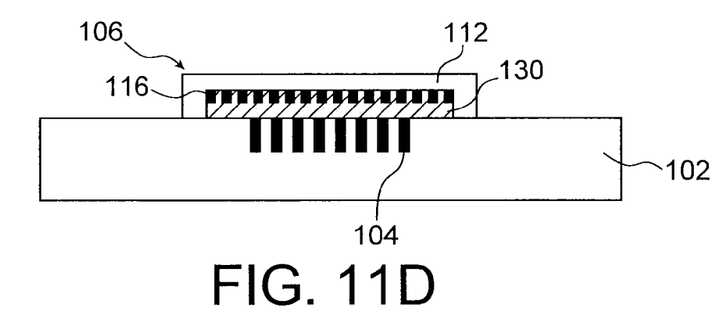

As shown in FIG. 11D, the layer 112 is then deposited, for example by means of a PECVD deposition (Plasma-Enhanced Chemical Vapour Deposition) of silicon nitride and/or silicon oxide. Silicon nitride can be used to reinforce the encapsulation layer.

Figure 11E:
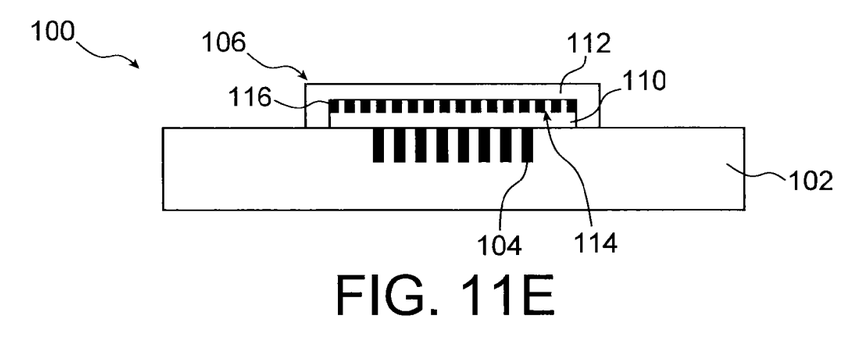

Lastly, the sacrificial layer 130 is etched, for example through an aperture made through the layer 112, thus forming the cavity 110 in which the microdevice 104 is encapsulated and the upper wall of which is formed by the face 114 of the layer 112, against which the mechanical reinforcement portions 116 are arranged.

As a variant it is possible to produce an additional mechanical reinforcement of the cap 106 by depositing, on the layer 112 (on the face of the layer 112 opposite the face 114), a continuous layer, for example made of metal, and by PVD with a thickness of about 1 μm, or by ECD, to obtain a thickness of material which can range from several microns to several tens of microns. This continuous layer is advantageously also deposited at the periphery of the cap 106, on the substrate 102, which enables the stiffness of this layer to be improved, bearing in mind a vault effect obtained with such a layer.

FIGS. 12A to 12F show the steps of a method for production of the encapsulation structure 100 according to the first embodiment, i.e. in which the cap 106 is produced by wafer cap packaging.

Figure 12A:
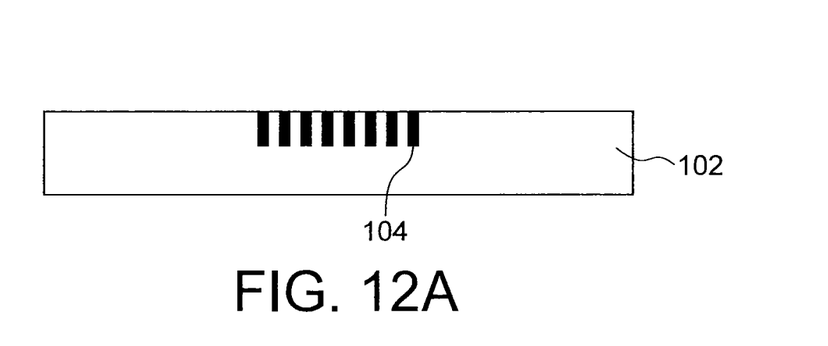
FIGS. 12A to 12F show the steps of a method to produce an encapsulation structure according to the first embodiment.

As shown in FIG. 12A, the microdevice 104 is firstly produced in the substrate 102 through the use of conventional microelectronics steps (deposition, photolithography, etching, etc.).

Figure 12B:
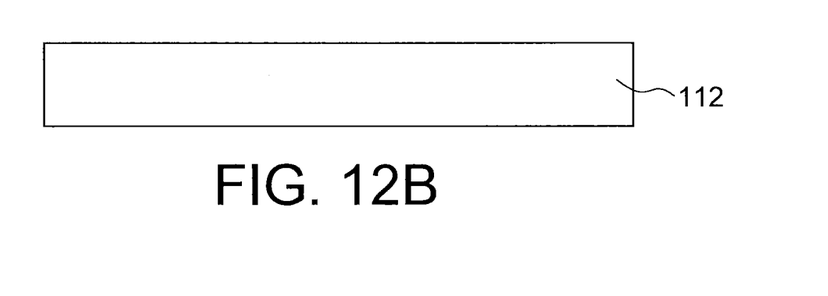

The cap 106 is then produced from a layer 112 corresponding to a substrate, or wafer, made for example of glass or silicon (FIG. 12B).

Figure 12C:
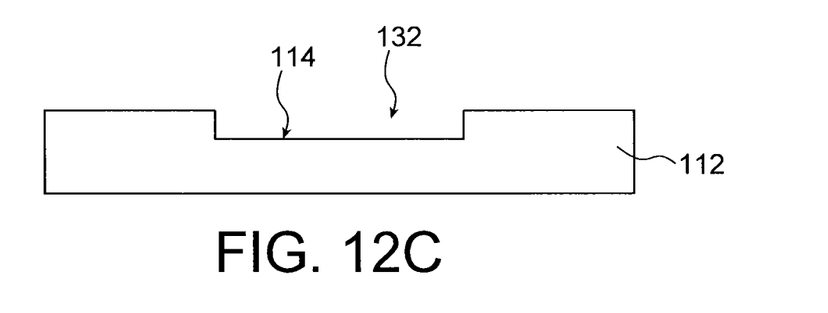

A recess 132 intended to form at least a part of the cavity 110 of the encapsulation structure 100 is etched in the layer 112, by this means revealing the face 114 of the layer 112 which will form the upper wall of the cavity 110 (FIG. 12C).

Figure 12D:
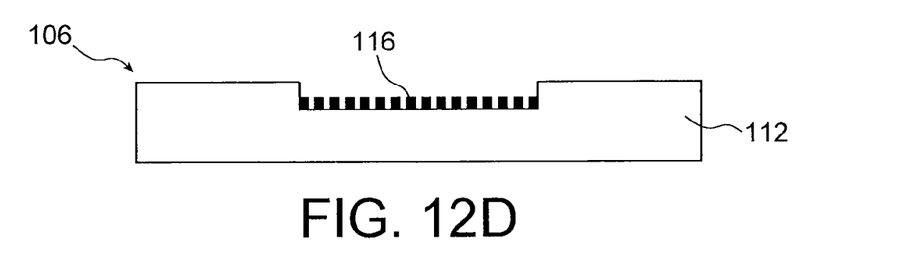

The mechanical reinforcement portions 116 are then produced against the face 114, in the recess 132 (FIG. 12D). These mechanical reinforcement portions 116 are, for example, produced by means of a first PVD deposition of a primer layer of titanium or chromium which is several tens of nanometers thick, followed by the deposition of a second barrier layer made of nickel, which is several hundreds of nanometers thick, and finally deposition of a third layer of Au which is several tens of nanometers thick. These three deposited layers form the germination layer, corresponding to the first layer 118. The material of the second layer 120 of the mechanical reinforcement portions 116 is then deposited by ECD with a thickness as described above, ranging from several microns to several tens of microns.

This deposition is, for example, carried out through patterns made in a photosensitive film arranged above the germination layer. Several layers of materials can be deposited through this film, notably terminating by the deposition of a metallic getter material, in order that the latter is exposed in the cavity 110. The material or materials deposited between the portions 116, on the photosensitive film, can be removed simultaneously with this film by lift-off. The parts of the germination layer located between the mechanical reinforcement portions 116 are then etched, for example by chemical means. Prior to this etching it is possible to protect the mechanical reinforcement portions 116, and in particular the getter material, by nitriding or oxidation, using a dry method, of this or these materials, by this means limiting the chemical attack of this or these materials during the chemical etching of the germination layer.

As a variant, when the material of the mechanical reinforcement portions 116 cannot be deposited by ECD this material can be deposited by PVD. In this case the different layers of the mechanical reinforcement portions 116 are firstly deposited, and then the mechanical reinforcement portions 116 are obtained by shaping these layers, for example using photolithography and lift-off or chemical etching of these layers.

Figure 12E:
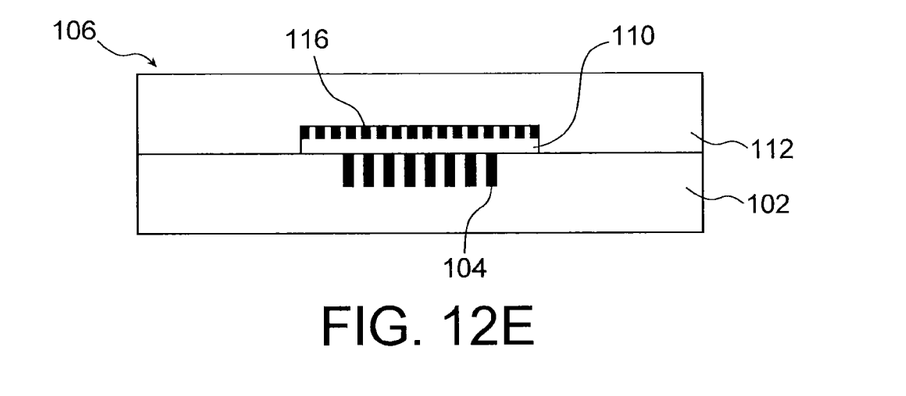

The cap 106 obtained in this manner is then rigidly attached to the substrate 102, directly or through a sealing bead, depending on the nature of the materials of the layer 112 and of the substrate 102. The microdevice 104 is then encapsulated in the cavity 110 in which the mechanical reinforcement portions 116 are located in the area of the upper wall of the cavity 110 (FIG. 12E).

Figure 12F:
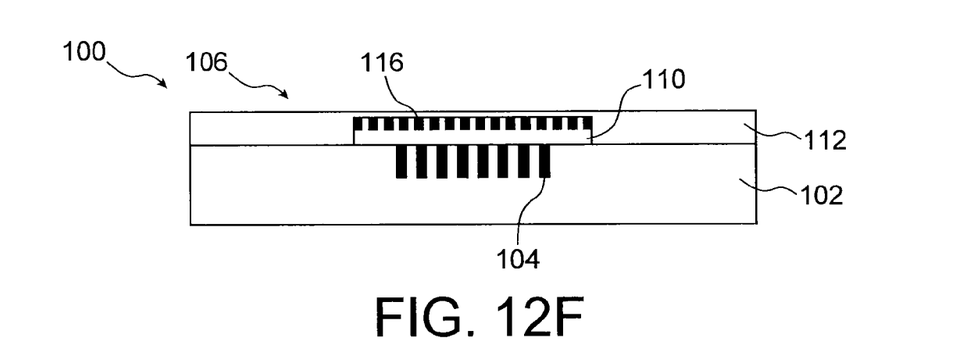

As shown in FIG. 12F, the encapsulation structure 100 is completed by thinning of the layer 112.

As a variant of the methods described above in connection with FIGS. 11A to 11E and 12A to 12F, the cap 106, including the layer 112 and the mechanical reinforcement portions 106, can firstly be produced in a mould corresponding, for example, to an etched glass or silicon substrate. To accomplish this, the substrate intended to be used as a mould is firstly etched according to the desired shape of the cap 106. A layer of polymer, for example PTFE, is deposited on the etched face of the mould. The layers intended to form the cap 106, i.e. the layer 112 and the layer or layers of the mechanical reinforcement portions 116, are then deposited on the polymer layer, for example using steps similar to those described above in connection with FIG. 12D. The cap 106 produced in the mould is then assembled on the substrate including the microdevice to be encapsulated by transferring the mould on to the substrate and rigidly attached to the substrate, for example by means of polymer bonding, or by eutectic melting or again by thermocompression. The mould is then detached from the cap 106 by eliminating the polymer layer in order to form the encapsulation structure. Details of implementation of such a method are for example described in documents FR 2 934 580 and U.S. Pat. No. 7,897,436.

The invention claimed is:

1. An encapsulation structure of at least one microdevice made on and/or in a substrate and arranged in at least one cavity formed between the substrate and a cap rigidly attached to the substrate, in which the cap includes at least:
    one layer of a first material, one face of which forms an inner wall of the cavity; and
    a plurality of mechanical reinforcement portions rigidly connected to at least said face of the layer of the first material and being arranged next to one another along the inner wall of the cavity, partly covering said face of the layer of the first material, and having gas absorption and/or adsorption properties, where these mechanical reinforcement portions include at least one second material, the Young's modulus of which is higher than that of the first material,
    and in which each of the mechanical reinforcement portions includes at least one first layer of the second material, and at least one second layer of a third metallic getter material such that the first layer of the second material is arranged between the layer of the first material and the second layer of the third material and/or is covered by the second layer of the third material.

2. The encapsulation structure according to claim 1, in which the second material is a metallic getter material.

3. The encapsulation structure according to claim 1, in which each of the mechanical reinforcement portions includes a stack of layers of which at least two of said layers form a bimetallic strip configured to exert on the cap a force directed outside of the cavity.

4. The encapsulation structure according to claim 1 in which the first material comprises Si and/or silica and/or silicon nitride, and the second material comprises Cr and/or Ti and/or Co and/or Fe and/or Mn and/or Mo and/or Ta and/or V and/or W and/or Pd and/or Rh and/or Pt and/or Ru and/or Zr.

5. The encapsulation structure according to claim 2, in which the metallic getter material(s) comprise Cr and/or Ti and/or Co and/or Fe and/or Mn and/or Mo and/or Ta and/or V and/or W and/or Pd and/or Rh and/or Pt and/or Ru and/or Zr.

6. The encapsulation structure according to claim 1, in which each of the mechanical reinforcement portions is of roughly rectangular parallelepipedic shape, and where the mechanical reinforcement portions are arranged roughly parallel to one another.

7. The encapsulation structure according to claim 1, in which the mechanical reinforcement portions form a mesh on said face of the layer of the first material.

8. The encapsulation structure according to claim 1, in which a ratio r=h/H is between about 0.6 and 0.9, and a ratio R=b/t is greater than or equal to about 0.7, where:
    h: thickness of the layer of the first material;
    H: sum of h and of the thickness of one of the mechanical reinforcement portions;
    b: width of one of the mechanical reinforcement portions;
    t: period with which the mechanical reinforcement portions are arranged on the layer of the first material.

9. The encapsulation structure according to claim 1, also including electrically conductive vias made all the way through the substrate and/or the layer of the first material, next to the cavity.

10. A microelectronic device including at least two encapsulation structures according to claim 9, arranged one above the other, in which at least one electrically conductive via of a first of the two encapsulation structures is electrically connected to at least one electrically conductive via of a second of the two encapsulation structures, directly or through an interposer.

11. An encapsulation structure of at least one microdevice made on and/or in a substrate and arranged in at least one cavity formed between the substrate and a cap rigidly attached to the substrate, in which the cap includes at least:
    one layer of a first material, one face of which forms an inner wall of the cavity; and
    mechanical reinforcement portions rigidly connected to at least said face of the layer of the first material, partly covering said face of the layer of the first material, and having gas absorption and/or adsorption properties, where these mechanical reinforcement portions include at least one second material, the Young's modulus of which is higher than that of the first material,
    and in which each of the mechanical reinforcement portions includes a stack of layers of which at least two of said layers form a bimetallic strip configured to exert on the cap a force directed outside of the cavity.

12. The encapsulation structure according to claim 11, in which at least one layer of said stack of layer and which is exposed inside the cavity comprises the second material which is a metallic getter material.

13. The encapsulation structure according to claim 11, in which the first material comprises Si and/or silica and/or silicon nitride, and the second material comprises Cr and/or Ti and/or Co and/or Fe and/or Mn and/or Mo and/or Ta and/or V and/or W and/or Pd and/or Rh and/or Pt and/or Ru and/or Zr.

14. The encapsulation structure according to claim 12, in which the metallic getter material(s) comprise Cr and/or Ti and/or Co and/or Fe and/or Mn and/or Mo and/or Ta and/or V and/or W and/or Pd and/or Rh and/or Pt and/or Ru and/or Zr.

15. The encapsulation structure according to claim 11, in which each of the mechanical reinforcement portions is of roughly rectangular parallelepipedic shape, and where the mechanical reinforcement portions are arranged roughly parallel to one another.

16. The encapsulation structure according to claim 11, in which the mechanical reinforcement portions form a mesh on said face of the layer of the first material.

17. The encapsulation structure according to claim 11, in which a ratio r=h/H is between about 0.6 and 0.9, and a ratio R=b/t is greater than or equal to about 0.7, where:
    h: thickness of the layer of the first material;
    H: sum of h and of the thickness of one of the mechanical reinforcement portions;
    b: width of one of the mechanical reinforcement portions;
    t: period with which the mechanical reinforcement portions are arranged on the layer of the first material.

18. The encapsulation structure according to claim 11, also including electrically conductive vias made all the way through the substrate and/or the layer of the first material, next to the cavity.

19. A microelectronic device including at least two encapsulation structures according to claim 18, arranged one above the other, in which at least one electrically conductive via of a first of the two encapsulation structures is electrically connected to at least one electrically conductive via of a second of the two encapsulation structures, directly or through an interposer.

\* \* \* \* \*